United States Patent
Kuhara et al.

(10) Patent No.: US 7,302,193 B2
(45) Date of Patent: Nov. 27, 2007

(54) OPTICAL RECEIVER

(75) Inventors: Yoshiki Kuhara, Suita (JP); Mitsuaki Nishie, Yokohama (JP); Shigeo Hayashi, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 609 days.

(21) Appl. No.: 10/941,690

(22) Filed: Sep. 15, 2004

(65) Prior Publication Data
US 2005/0100349 A1    May 12, 2005

(30) Foreign Application Priority Data
Sep. 18, 2003  (JP) .............. 2003/326192

(51) Int. Cl.
*H04B 10/06* (2006.01)
(52) U.S. Cl. .............. 398/202; 398/212; 398/213; 398/214
(58) Field of Classification Search .............. 398/202, 398/207, 208, 212, 213, 214; 385/14, 27, 385/31, 33, 39, 60, 89, 92
See application file for complete search history.

(56) References Cited

U.S. PATENT DOCUMENTS

| | | | |
|---|---|---|---|
| 6,894,322 B2* | 5/2005 | Kwan et al. .............. | 257/186 |
| 6,934,478 B2* | 8/2005 | Fujita et al. .............. | 398/141 |
| 7,018,110 B2* | 3/2006 | Kuhara et al. .............. | 385/89 |
| 7,224,910 B2* | 5/2007 | Sherazi et al. .............. | 398/207 |
| 2004/0071411 A1* | 4/2004 | Nakanishi et al. ............ | 385/92 |

FOREIGN PATENT DOCUMENTS

| | | |
|---|---|---|
| JP | 63-77171 | 4/1988 |
| JP | 63-105541 | 5/1988 |

* cited by examiner

*Primary Examiner*—Dalzid Singh
(74) *Attorney, Agent, or Firm*—Fish & Richardson P.C.

(57) ABSTRACT

An optical receiver includes a PIN photodiode (PIN-PD) having an incident surface for receiving signal light, the PIN-PD transmitting a part of the signal light to the surface opposite to the incident surface, and an avalanche photodiode (APD) having an incident surface for receiving light transmitted through the PIN-PD. In the optical receiver, the ratio of the quantity of signal light detected by the PIN-PD and the ratio of the quantity of signal light detected by the APD are not affected by the polarization state of the signal light incident on the optical receiver, and accordingly the avalanche multiplication factor of the APD is suitably controlled on the basis of the signal light detected by the PIN-PD.

20 Claims, 13 Drawing Sheets

OPTICAL RECEIVER

BACKGROUND OF THE INVENTION

1. Field of the Invention

The present invention relates to an optical receiver which detects signal light with an avalanche photodiode.

2. Description of the Background Art

In an optical communication system, an optical receiver employing an avalanche photodiode (hereafter abbreviated as APD) as a photodetector is used conventionally. APDs have a function to amplify signal photocurrents and are suitable for use as photodetectors in optical fiber communication systems using weak optical signals.

A characteristic of a typical APD is that an avalanche multiplication factor thereof varies due to temperature variation or the like. This characteristic is due to a relatively high reverse bias voltage applied to the APD when avalanche multiplication is performed. More specifically, the APD is operated at a voltage close to a breakdown voltage of a PN junction, and therefore the operating characteristics of the APD are extremely sensitive to variation in ambient temperature or the like. Accordingly, the avalanche multiplication factor of the APD is preferably controlled such that a constant multiplication factor can be obtained even when temperature variation or the like occurs.

Japanese Unexamined Patent Application Publication No. 63-105541 discloses an optical receiver in which a multiplication factor of an APD is controlled. The structure of this optical receiver is shown in FIG. 13. This optical receiver includes an APD 111 and a photodiode 112. In this optical receiver, the APD 111 receives signal light emitted from an optical fiber 113, and the photodiode 112 receives signal light reflected by a light-receiving area of the APD 111. The multiplication factor of the APD 111 is controlled on the basis of an output current value obtained by the photodiode 112.

However, in the optical receiver disclosed in Japanese Unexamined Patent Application Publication No. 63-105541, the signal light is incident on the APD 111 at an angle, and the reflected light is incident on the photodiode 112. When the signal light is incident on the light-receiving area of the APD 111 at an angle, the reflectance of the signal light varies depending on the polarization state of the signal light. Therefore, in this optical receiver, the quantity of signal light incident on the photodiode 112 varies depending on the polarization state of the signal light emitted from the optical fiber 113, and it is difficult to suitably control the avalanche multiplication factor of the APD 111.

SUMMARY OF THE INVENTION

In view of the above-described problem, an object of the present invention is to provide an optical receiver in which an avalanche multiplication factor of an APD can be suitably controlled.

In order to attain the above-described object, according to the present invention, an optical receiver includes a PIN photodiode and an avalanche photodiode, which are structured such that the PIN photodiode has an incident surface for receiving signal light and transmits a part of the signal light to the surface opposite to the incident surface, and the avalanche photodiode has an incident surface for receiving the signal light transmitted through the PIN photodiode.

In this optical receiver, the signal light detected by the PIN photodiode (hereafter abbreviated as PIN-PD) and the signal light detected by the avalanche photodiode (hereafter abbreviated as APD) are separated in a manner such that the PIN-PD transmits a part of the received signal light so that the signal light transmitted through the PIN-PD is incident on the APD. Accordingly, signal light can be allowed to be incident on the PIN-PD and the APD at a constant given ratio of quantity of light since the quantity of light of signal light detected by the PIN-PD and the quantity of light of signal light detected by the APD are not affected by the polarization state of the signal light incident on the optical receiver. Therefore, the avalanche multiplication factor of the APD can suitably be controlled on the basis of the signal light detected by the PIN-PD.

The optical receiver according to the present invention may further include a stem having a principal plane and a mounting part provided on the principal plane of the stem, the PIN photodiode being mounted on the mounting part. The avalanche photodiode may be disposed between the PIN photodiode and the principal plane so as to receive, via an opening provided in the mounting part, light transmitted through the PIN photodiode.

Alternatively, the optical receiver according to the present invention may further include a stem on which the avalanche photodiode is mounted, and the PIN photodiode may be mounted on the avalanche photodiode.

According to one embodiment of the present invention, an optical receiver may have a substrate having a principal plane, in which a groove is provided and a reflective surface is provided at one end of the groove; an optical transmission medium provided in the groove; a PIN photodiode provided on the principal plane; and an avalanche photodiode mounted on the PIN photodiode. In this embodiment, the PIN photodiode may have an incident surface for receiving, via the reflective surface, signal light emitted from the optical transmission medium, and transmit a part of the signal light incident on the incident surface to the surface opposite to the incident surface, and the avalanche photodiode may have an incident surface for receiving light transmitted through the PIN photodiode.

In this optical receiver, light emitted from the optical transmission medium is received by the incident surface of the PIN photodiode via the reflective surface. Since the reflective surface for inputting the signal light is provided on the principal plane, the size of the optical receiver is easily reduced.

The optical receiver according to the present invention may further include a control means for controlling, on the basis of an output current value obtained from the PIN photodiode, either one or both of a current flowing through the avalanche photodiode and a supply voltage applied to the avalanche photodiode such that an avalanche multiplication factor of the avalanche photodiode is maintained at a predetermined value. Accordingly, the avalanche multiplication factor of the APD can be suitably controlled.

In this optical receiver, the control means may control either one or both of the supply voltage applied to the avalanche photodiode and the current flowing through the avalanche photodiode such that an average output current value obtained from the avalanche photodiode when the signal light is incident approaches the value of $m \cdot Ipin1 \cdot (Iava_2/Ipin_2)$, where $Iava_2$ is an output current value in a PIN mode of the avalanche photodiode at a time when a quantity of light is incident and $Ipin_2$ is an output current value of the PIN photodiode at that time, m is a desired avalanche multiplication factor, and $Ipin1$ is the value of an output current from the PIN photodiode.

The control means of the optical receiver may be provided with a converting circuit for converting the output current value obtained from the PIN photodiode into a voltage signal; a current mirror circuit having an input, a first output, and a second output, the ratio of the amount of current at the second output to the amount of current at the first output being maintained at a predetermined ratio and the first output being connected to the avalanche photodiode; a power supply circuit for supplying the supply voltage to the input of the current mirror circuit; and a voltage control circuit for controlling the supply voltage on the basis of the voltage signal obtained from the converting circuit and the amount of current at the second output of the current mirror circuit. In this optical receiver, the supply voltage applied to the APD is controlled on the basis of the amount of current at the second output using the fact that the amount of current at the second output of the current mirror circuit is substantially equal to the amount of current supplied to the APD from the first output of the current mirror circuit. Accordingly, the avalanche multiplication factor of the APD can be more suitably controlled.

Alternatively, in the optical receiver, the control unit may include a converting circuit for converting the output current value obtained from the PIN photodiode into a voltage signal; a current mirror circuit having an input, a first output, and a second output, the ratio of the amount of current at the second output to the amount of current at the first output being maintained at a predetermined ratio and the second output being connected to the avalanche photodiode; a power supply circuit for supplying the supply voltage to the input of the current mirror circuit; and a current control circuit for controlling the amount of current at the first output of the current mirror circuit on the basis of the voltage signal obtained from the converting circuit. In this optical receiver, the amount of current supplied to the APD from the second output is controlled by controlling the amount of current at the first output using the fact that the amount of current at the second output of the current mirror circuit is substantially equal to the amount of current supplied to the APD from the first output of the current mirror circuit.

As described above, in the optical receiver of the present invention, the avalanche multiplication factor of the APD can be suitably controlled on the basis of the output current of the PIN-PD.

DETAILED DESCRIPTION OF THE INVENTION

Figure 1:
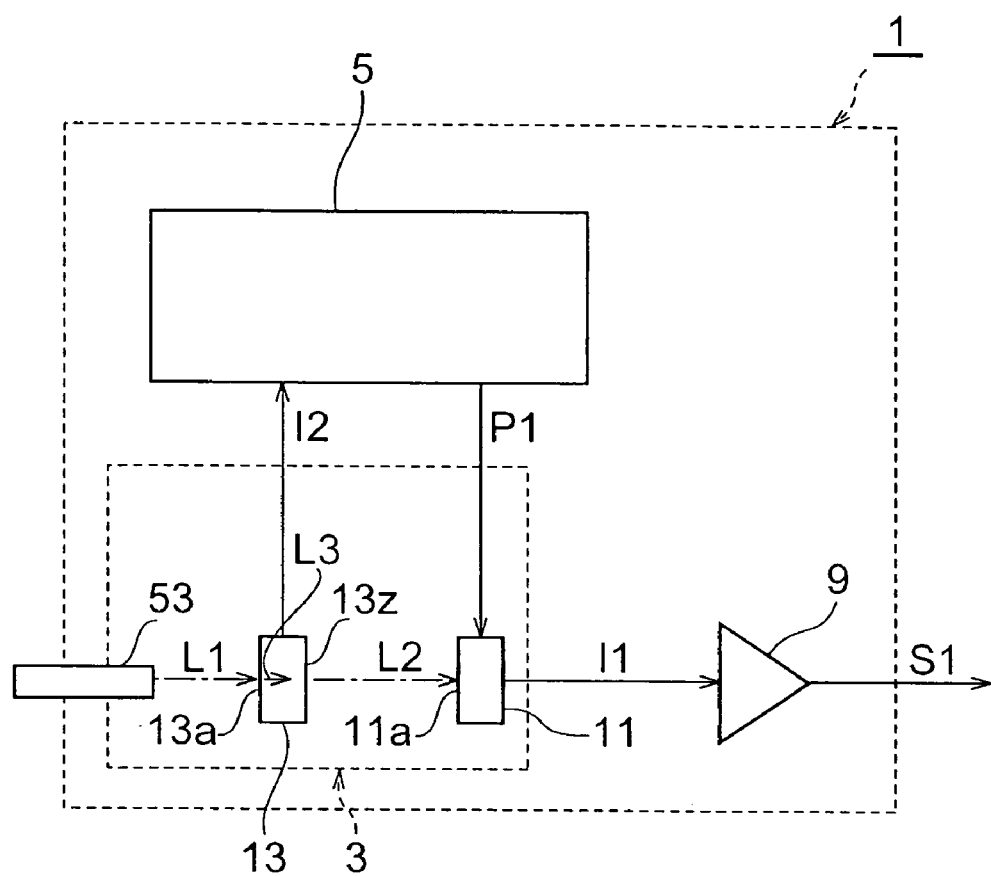
FIG. 1 is a block diagram showing an optical receiver according to an embodiment of the present invention.

An optical receiver according to an embodiment of the present invention will be described below with reference to the accompanying drawings. In the figures, similar components are denoted by the same reference numerals and redundant explanations are thus omitted.

FIG. 1 is a block diagram showing an optical receiver according to an embodiment of the present invention. With reference to FIG. 1, an optical receiver 1 according to the present embodiment includes an optical module 3, a control part 5, and an amplifier 9. The optical module 3 includes an APD 11 and a PIN-PD 13.

In the optical module 3, the PIN-PD 13 is positioned such that signal light L1 input from the outside of the optical receiver 1 via an optical transmission medium 53 is incident on an incident surface 13a of the PIN-PD 13. A part of the signal light L1 (hereafter defined as signal light L3) is converted into an output current I2 by the PIN-PD 13. Another part of the signal light L1 (hereafter defined as signal light L2) is transmitted toward the opposite surface 13z of the PIN-PD 13. The APD 11 is positioned such that the signal light L2 is incident on an incident surface 11a of the APD 11. The quantity of signal light L2 is, for example, 90% to 99% of the quantity of signal light L1.

The APD 11 converts the signal light L2 into an output current I1. A cathodic electrode of the APD 11 is electrically connected to the control part 5, and an anodic electrode of the APD 11 is electrically connected to the amplifier 9. The APD 11 is activated when the cathodic electrode receives a supply voltage P1 from the control part 5, and generates the output current I1 when the signal light L2 is incident on the incident surface 11a. At this time, in the APD 11, a photo-current generated when the signal light L2 is incident is multiplied at a predetermined multiplication factor due to the avalanche multiplication function, and thus the output current I1 is generated. The APD 11 supplies the generated output current I1 to the amplifier 9 from the anodic electrode thereof. The amplifier 9 generates a received signal S1 by converting the output current I1 obtained from the APD 11 into a voltage signal and amplifying it, and supplies the received signal S1 to the outside of the optical receiver 1.

The PIN-PD 13 converts a part of the signal light L1 (signal light L3) into the output current I2, and transmits another part of the signal light L1 (signal light L2). The quantity of signal light L2 is 90% to 99% of the quantity of signal light L1. A cathodic electrode of the PIN-PD 13 is electrically connected to a predetermined power supply (not shown), and an anodic electrode of the PIN-PD 13 is electrically connected to the control part 5. The PIN-PD 13 generates the output current I2 when the signal light L3 is incident on the incident surface 13a. The PIN-PD 13 supplies the generated output current I2 to the control part 5 from the anodic electrode thereof.

The control part 5 can be used as the control means according to the present invention. The control part 5 controls the supply voltage P1 applied to the APD 11 on the basis of the output current value obtained from the PIN-PD 13 such that the avalanche multiplication factor of the APD 11 is maintained at a predetermined value. The control part 5 detects the quantity of signal light L3 on the basis of the output current I2 obtained from the PIN-PD 13. The control part 5 generates, on the basis of the quantity of signal light L3, the supply voltage P1 applied to the APD 11 such that the APD 11 performs, at a desired multiplication factor, avalanche multiplication of the photocurrent generated in accordance with the quantity of signal light L2. The control part 5 may be, for example, an arithmetic unit including a central processing unit (CPU), an electric circuit, etc.

Figure 2:
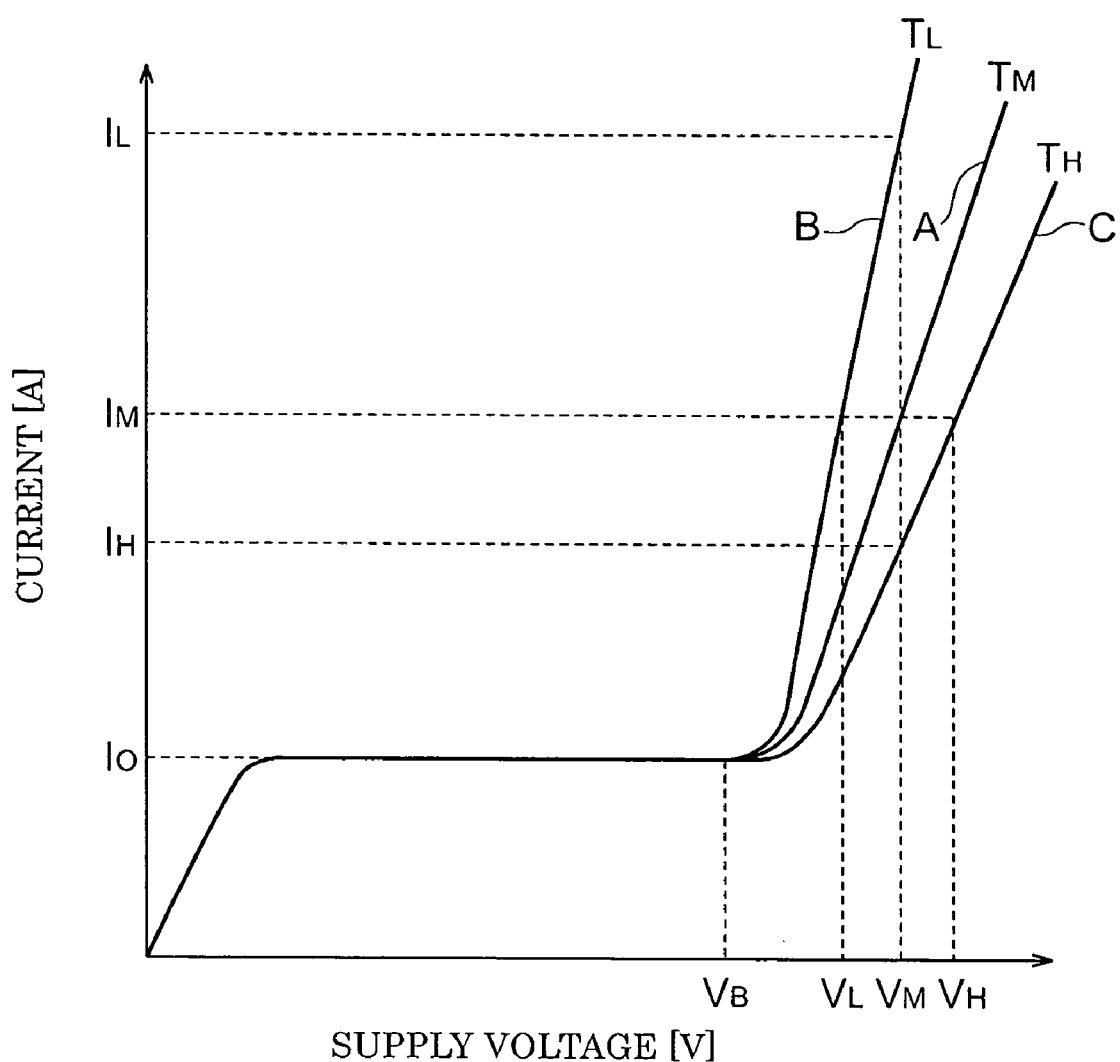
FIG. 2 is a graph showing the characteristics of output current of an APD versus a supply voltage applied thereto.

The above-described function of the control part 5 will be described in more detail below. FIG. 2 is a graph showing the characteristics of output current of an APD versus a supply voltage applied thereto. In the graph shown in FIG. 2, it is assumed that the quantity of light incident on the incident surface 11a of the APD 11 is constant. With reference to FIG. 2, the APD 11 generates a photocurrent $I_0$ corresponding to the quantity of incident light when a supply voltage lower than a predetermined voltage $V_B$ is applied to the APD 11 (this state is called a PIN mode in the APD 11). When a supply voltage higher than the predetermined voltage $V_B$ is applied to the APD 11, the APD 11 performs the avalanche multiplication function and the output current value obtained from the APD 11 is thus equivalent to the product of the photocurrent I0 and a predetermined multiplication factor.

The avalanche multiplication is caused by a relatively high reverse bias voltage being applied to the APD 11. At this time, the APD 11 works at a voltage close to a breakdown voltage of a PN junction, and therefore the operating property depends on the temperature of the APD 11. For example, in the graph of FIG. 2, the curves A, B, and C show the operating properties of the APD 11 at temperatures of $T_M$, $T_L$, and $T_H$, respectively ($T_L<T_M<T_H$). Thus, even when the quantity of light is constant and the supply voltage applied to the APD 11 is fixed (for example, $V_M$), the output current value obtained from the APD 11 varies to $I_H$, $I_M$, and $I_L$, depending on the temperature.

In the graph shown in FIG. 2, for example, in order to obtain an output current of $I_M$ (=m·$I_0$, where m is a desired avalanche multiplication factor) with a predetermined quantity of incident light, the supply voltage value should be changed to $V_L$, $V_M$, and $V_H$, corresponding to the variation in the properties of the APD 11. Conventionally, a method is used in which the temperature of the APD is detected using a thermistor or the like and the supply voltage is changed depending on the temperature of the APD. However, it is difficult to obtain the desired avalanche multiplication factor m with high accuracy by this method, since an APD has its own temperature characteristics different from those of other APDs.

In comparison, the control part 5 according to the present embodiment controls the avalanche multiplication factor of the APD 11 on the basis of the output current I2 obtained from the PIN-PD 13. The value of the output current I1 obtained by the APD 11 in the PIN mode when a predetermined quantity of light is incident on the optical receiver 1 is denoted by Iava$_2$ (A), and the value of the output current I2 obtained by the PIN-PD 13 at this time is denoted by Ipin$_2$ (A). The control part 5 controls the supply voltage P1 such that the average value of the output current I1 obtained by the APD 11 when the signal light L2 is incident on the APD 11 approaches m·Ipin1·(Iava$_2$/Ipin$_2$), where m is the desired avalanche multiplication factor and Ipin1 is the current value (A) of the output current I2 obtained by the PIN-PD 13 corresponding to the signal light L3. Accordingly, the desired avalanche multiplication factor m can be obtained in the APD 11 without being affected by temperature variation or the like. The average value of the output current I2 is the time average of the output current I2 corresponding to the pulsed signal light L1 (L2) over a sufficiently long time covering a plurality of pulses. The average value of the output current I2 can be obtained using, for example, an integrating circuit.

Figure 3:
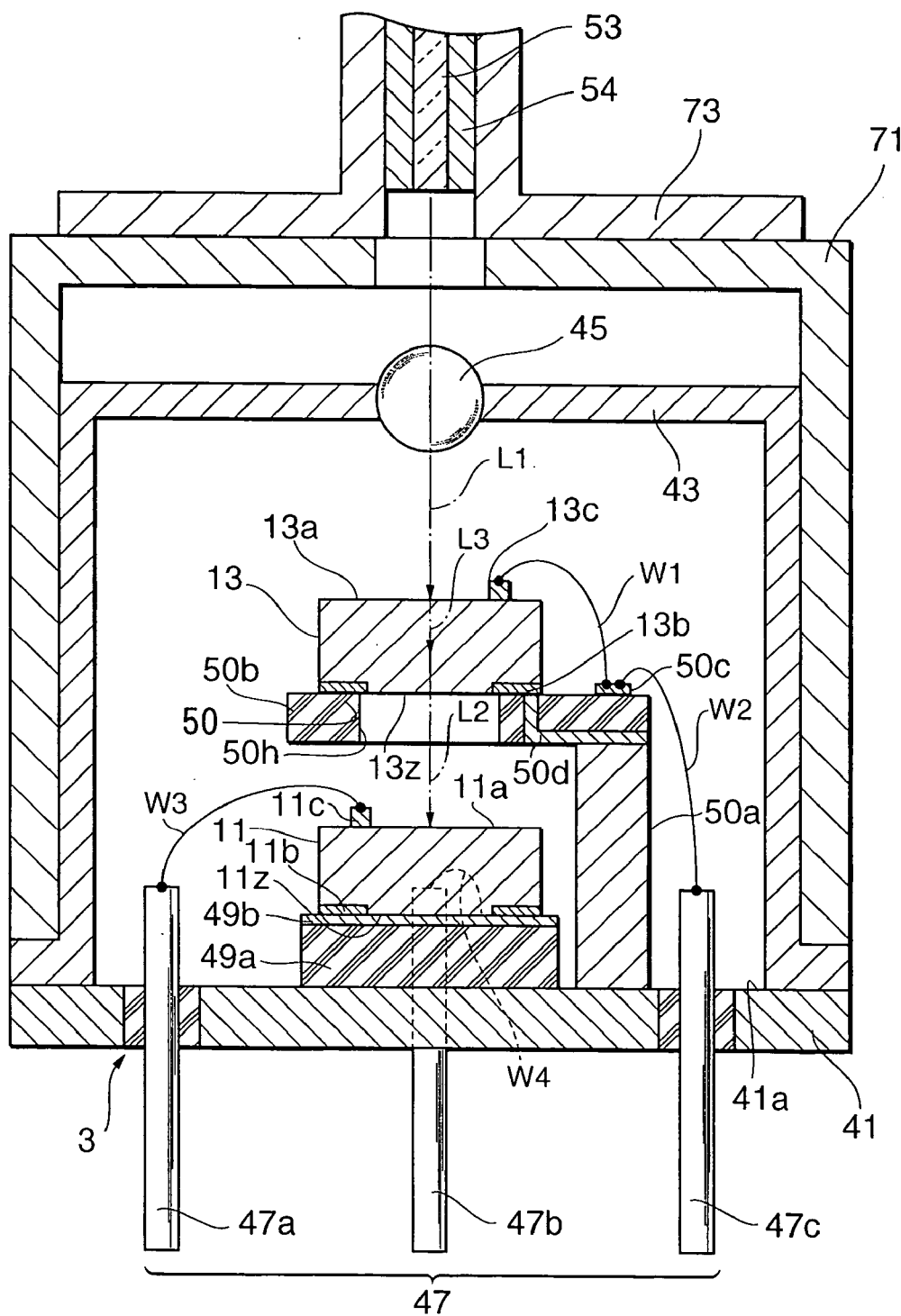
FIG. 3 is a sectional view showing an optical module according to one embodiment of the present.

Next, the optical module 3 will be described in detail below. FIG. 3 is a sectional view showing the optical module 3 according to the present embodiment. The optical module 3 has a structure of a so-called coaxial-type CAN package, and includes a stem 41, a cap 43, a lens 45, the APD 11, the PIN-PD 13, a submount 49a, a mounting part 50, and lead pins 47. A sleeve 71 is mounted on the stem 41. Another sleeve 73 is mounted on the sleeve 71, and the sleeve 73 retains a ferrule 54. The ferrule 54 retains the optical transmission medium 53. The optical module 3 receives signal light input from the outside via the optical transmission medium 53. The optical transmission medium 53, the lens 45, the PIN-PD 13, a submount 50b included in the mounting part 50, the APD 11, the submount 49a, and the stem 41 are arranged along a predetermined axis. The incident surface 13a of the PIN-PD 13 and the incident surface 11a of the APD 11 are across the predetermined axis substantially perpendicularly. The signal light is emitted from the optical transmission medium 53 toward the lens 45. The signal light L1 that has passed through the lens 45 is substantially perpendicularly incident on the incident surface 13a. The signal light L2 that has passed through the PIN-PD 13 is substantially perpendicularly incident on the incident surface 11a.

The stem 41 is a disc-shaped member having a diameter of, for example, 5.6 mm, and is provided with a plurality of lead pins 47 which extend through the stem 41. The stem 41 is composed of a metal material such as stainless steel, copper, and iron.

The mounting part 50 includes a pole 50a and the submount 50b. The pole 50a projects upward from a principal plane 41a of the stem 41, and is substantially perpendicular to the principal plane 41a. The pole 50a is composed of a metal material such as stainless steel, copper, and iron. The submount 50b is supported by the pole 50a at one end thereof, and extends substantially parallel to the principal plane 41a from that end. The submount 50b is composed of a ceramic material such as alumina and zirconia. The PIN-PD 13 is mounted on the submount 50b. The submount 50b has an opening 50h at the central region thereof. The signal light L2 transmitted through the PIN-PD 13 can travel through the opening 50h.

An anodic electrode 13c of the PIN-PD 13 is electrically connected to a pattern electrode 50c formed on the submount 50b with a lead-wire W1, and the pattern electrode 50c is electrically connected to a lead pin 47c with a lead-wire W2. A cathodic electrode 13b of the PIN-PD 13 is electrically connected to a through-hole electrode 50d embedded in the submount 50b. The through-hole electrode 50d is electrically connected to the pole 50a, and the pole 50a is electrically connected to the stem 41. The stem 41 is electrically connected to a lead pin (not shown). Due to the above-described connections, the PIN-PD 13 provides the output current I2 to the outside of the optical module 3 via the lead pin 47c and the other lead pin (not shown). The lead pin 47c is electrically connected to the control part 5, and the other lead pin (not shown) is electrically connected to a predetermined power supply.

The submount 49a is placed on the principal plane 41a of the stem 41, and the APD 11 is placed on the submount 49a. Thus, the APD 11 is disposed between the principal plane 41a and the PIN-PD 13. A gap is provided between the incident surface 11a of the APD 11 and the opposite surface 13z of the PIN-PD 13. An anodic electrode 11c of the APD 11 is electrically connected to a lead pin 47a with a lead-wire W3. A cathodic electrode 1b of the APD 11 is electrically connected to an electrode 49b formed on the submount 49a. The electrode 49b is electrically connected to a lead pin 47b with a lead-wire W4. Due to the above-described connections, the APD 11 provides the output current I1 to the outside of the optical module 3 via the lead pins 47a and 47b. The lead pin 47b is electrically connected to the control part 5 and the lead pin 47a is electrically connected to the amplifier 9 (see FIG. 1). The incident surface 11a of the APD 11 is optically coupled to the opposite surface 13z of the PIN-PD 13 through the opening 50h.

The cap 43 covers the APD 11, the PIN-PD 13, and the mounting part 50. The cap 43 has a cylindrical shape with one end closed, and is composed of a metal material such as stainless steel, iron, iron-nickel alloy, and brass. The cap 43 is fixed to the stem 41 such that the other end of the cap 43 is in contact with the principal plane 41a of the stem 41. The lens 45 is provided at the closed end of the cap 43, and is optically coupled with the incident surface 13a of the PIN-PD 13. The lens 45 converges the signal light L1, and then the signal light L1 is incident on the incident surface 13a of the PIN-PD 13.

Figure 4:
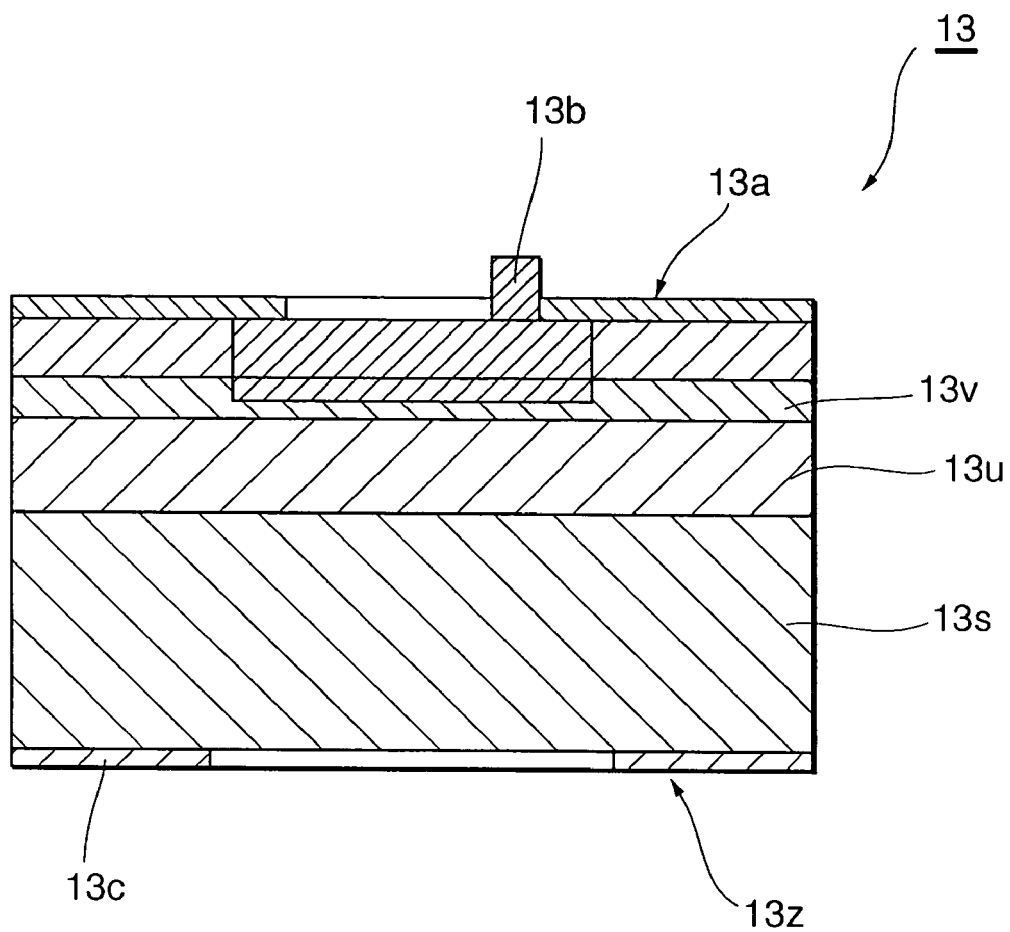
FIG. 4 is a sectional view of a PIN-PD.

FIG. 4 is a sectional view of the PIN-PD 13. The PIN-PD 13 includes a substrate 13s, a buffer layer 13u, and a light-receiving layer 13v. The substrate 13s is composed of, for example, $n^+$-InP and has a thickness of 100 μm to 300 μm. The buffer layer 13u is composed of, for example, n-InP and has a thickness of 1 μm to 2 μm. The light-receiving layer 13v is composed of, for example, n-InGaAs. Since the transmissivity of the PIN-PD 13 depends on the thickness of the light-receiving layer 13v, the transmissivity of the PIN-PD 13 can be set to a desired value by adjusting the thickness of the light-receiving layer 13v.

When the light-receiving layer 13v is composed of n-InGaAs, the thickness d of the light-receiving layer 13v is set as described below. When the absorption coefficient of n-InGaAs is α, the relationship between the transmissivity T of the PIN-PD 13 and the thickness d can be expressed as follows:

$$d = -\ln T/\alpha \quad (1)$$

Since the absorption coefficient α of n-InGaAs is $1.3 \times 10^4$ cm$^{-1}$, the thickness d can be expressed as follows:

$$d(\mu m) = -\ln T/1.3 \quad (2)$$

When, for example, the desired transmissivity T of the PIN-PD 13 is 90%, d should be adjusted to 0.081 μm according to Eq. (2). Likewise, when the desired transmissivity T of the PIN-PD 13 is 99%, d should be set to 0.0077 μm according to Eq. (2).

Figure 5:
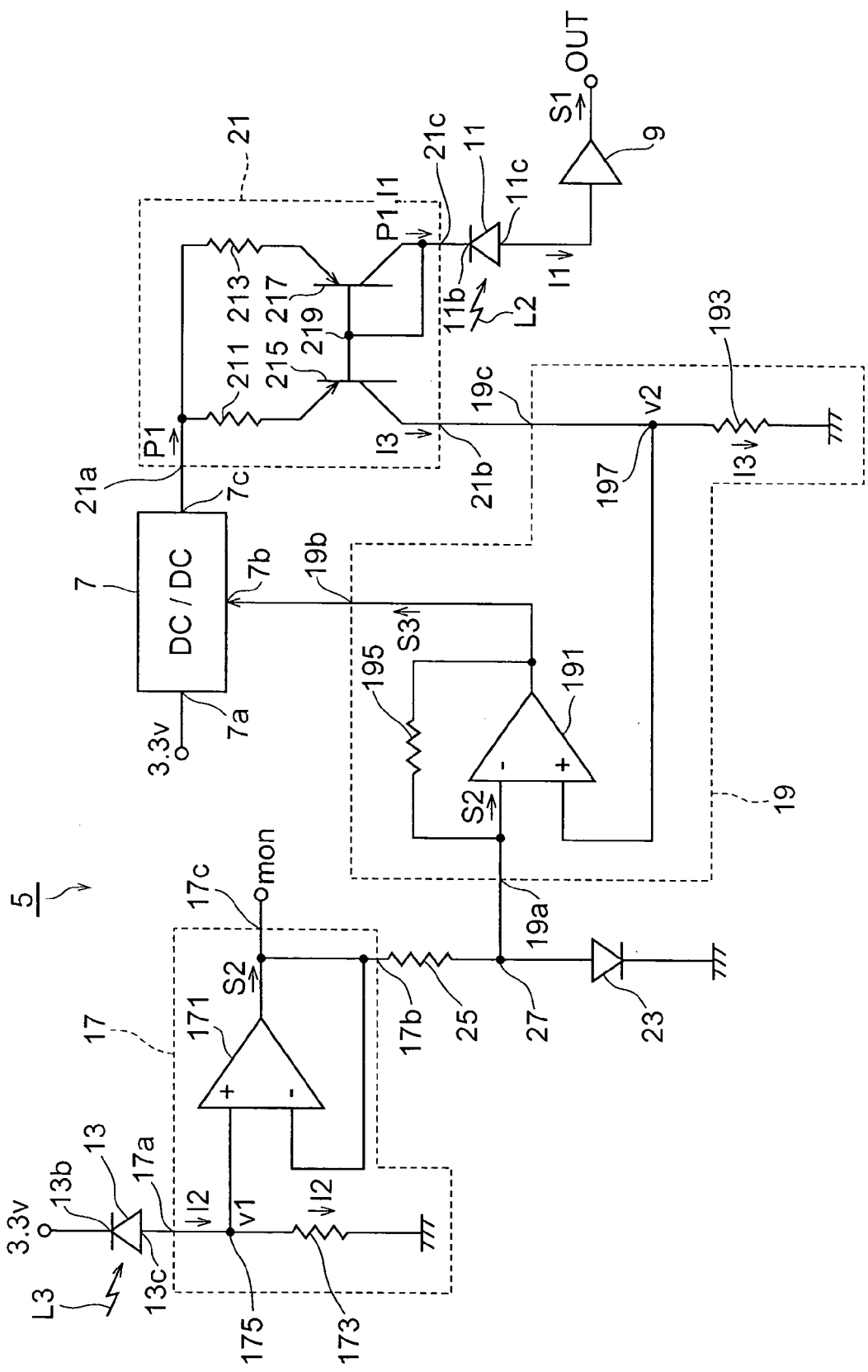
FIG. 5 is a circuit diagram showing an internal circuit of a control part.

Next, the control part 5 will be described in detail below. FIG. 5 is a circuit diagram showing an internal circuit of the control part 5. The control part 5 includes a DC-DC converter 7, a converting circuit 17, a current mirror circuit 21, and a voltage control circuit 19. The DC-DC converter 7 is used as a power supply circuit. The DC-DC converter 7 has inputs 7a and 7b and an output 7c. The input 7a is electrically connected to a power-supply terminal of a predetermined voltage (for example, 3.3 V). The output 7c is electrically connected to the current mirror circuit 21. The input 7b is electrically connected to the voltage control circuit 19, and the DC-DC converter 7 receives a control signal S3, which will be described below, from the voltage control circuit 19. The DC-DC converter 7 transforms, based on the control signal S3, the supply voltage applied from the power-supply terminal, and generates the supply voltage P1. Then, the DC-DC converter 7 supplies the supply voltage P1 to the current mirror circuit 21 from the output 7c.

The current mirror circuit 21 includes resistance elements 211 and 213 and PNP transistors 215 and 217. In addition, the current mirror circuit 21 has an input 21a, an output 21b (second output), and an output 21c (first output). In the current mirror circuit 21, the ratio of the amount of current at the output 21b to the amount of current at the output 21c is set to a predetermined current ratio. In the present embodiment, this current ratio is 1. The emitter terminal of the transistor 215 is electrically connected to the input 21a via the resistance element 211. The emitter terminal of the transistor 217 is electrically connected to the input 21a via the resistance element 213. The input 21a of the current mirror circuit 21 is electrically connected to the output 7c of the DC-DC converter 7, and receives the supply voltage P1 from the DC-DC converter 7. The base terminal of the transistor 215 and that of the transistor 217 are electrically connected to each other via a node 219. The node 219 is electrically connected to the collector terminal of the transistor 217. The collector terminal of the transistor 215 is electrically connected to the output 21b of the current mirror circuit 21. The collector terminal of the transistor 217 is electrically connected to the cathodic electrode 11b of the APD 11 via the output 21c of the current mirror circuit 21. As described above, the anodic electrode 11c of the APD 11 is electrically connected to the amplifier 9.

The converting circuit 17 includes a buffer amplifier 171 and a resistance element 173. In addition, the converting circuit 17 has an input 17a and outputs 17b and 17c. One end of the resistance element 173 is electrically connected to the anodic electrode 13c of the PIN-PD 13 via a node 175 and the input 17a. The cathodic electrode 13b of the PIN-PD 13 is electrically connected to a power-supply terminal of a predetermine voltage (for example, 3.3 V). The other end of the resistance element 173 is electrically connected to a reference voltage wire. A positive input terminal of the buffer amplifier 171 is electrically connected to the node 175, and a negative input terminal of the buffer amplifier 171 is electrically connected to an output terminal of the buffer amplifier 171. The output terminal of the buffer amplifier 171 is electrically connected to a monitor terminal via the output 17c, and is also electrically connected to one end of a resistance element 25 via the output 17b. The other end of the resistance element 25 is electrically connected to a reference voltage wire via a node 27 and a diode 23.

The voltage control circuit 19 includes an OP amplifier 191 and resistance elements 193 and 195. In addition, the voltage control circuit 19 has inputs 19a and 19c and an output 19b. A negative input terminal of the OP amplifier 191 is electrically connected to the node 27 via the input 19a, and is also electrically connected to an output terminal of the OP amplifier 191 via the resistance element 195. The output terminal of the OP amplifier 191 is electrically connected to the input 7b of the DC-DC converter 7 via the output 19b of the voltage control circuit 19. A positive input terminal of the OP amplifier 191 is electrically connected to a node 197. The node 197 is electrically connected to a reference voltage wire via the resistance element 193, and is also electrically connected to the output 21b of the current mirror circuit 21 via the input 19c of the voltage control circuit 19.

Next, the operation of the optical receiver 1 will be described below. With reference to FIG. 3 again, the lens 45 converges the signal light L1, and then the signal light L1 is incident on the incident surface 13a of the PIN-PD 13. A part of the signal light L1 (defined as signal light L3) is converted into the output current I2 by the PIN-PD 13. Another part of the signal light L1 (defined as signal light L2) is transmitted through the PIN-PD 13 to the opposite surface 13z thereof. The thus transmitted signal light L2 is incident on the incident surface 11a of the APD 11. The incident signal light L2 is converted into the output current I1 by the APD 11. Thus, the signal light L1 is divided into the signal light L3 incident on and detected by the PIN-PD 13 and the signal light L2 incident on and detected by the APD 11.

With reference to FIG. 5 again, a reverse bias voltage of 3.3 V is applied between the cathodic electrode 13b and the anodic electrode 13c of the PIN-PD 13, and the output current I2 corresponding to the quantity of signal light L3 flows when the signal light L3 is incident on the PIN-PD 13. The output current I2 is input to the converting circuit 17, flows through the node 175 and the resistance element 173, and reaches the reference voltage wire. As a result of the current I2 flowing through the resistance element 173, the potential at the node 175 and the potential at the positive input terminal of the buffer amplifier 171 are changed to V1. Then, a voltage signal S2 corresponding to the quantity of signal light L3 is output from the output terminal of the buffer amplifier 171.

The voltage signal S2 is output from the output 17b of the converting circuit 17, and is input to the voltage control circuit 19 via the resistance element 25 and the node 27. In this circuit, when excessive quantity of light is input to the PIN-PD 13 and the voltage value of the voltage signal S2 exceeds a predetermined limit, the diode 23 serves to prevent the OP amplifier 191 from receiving an excessive amount of current.

The DC-DC converter 7 supplies the supply voltage P1 between the cathodic electrode 11b and the anodic electrode 11c of the APD 11 as a reverse bias voltage via the current mirror circuit 21. When the signal light L2 is incident on the APD 11, the output current I1 corresponding to the quantity of signal light L2 flows in the APD 11. The amplifier 9 generates the received signal S1 by converting the output current I1 into a voltage signal, and the received signal S1 is supplied to the outside of the optical receiver 1. At this time, the current mirror circuit 21 operates such that the amount of current I3 which flows through the resistance element 211 and the transistor 215 is substantially equal to the amount of current I1 which flows through the resistance element 213 and the transistor 217. The current I3 is output from the output 21b of the current mirror circuit 21, flows through the input 19c of the voltage control circuit 19, the node 197, and the resistance element 193, in that order, and reaches the reference voltage wire. As a result of the current I3 flowing through the resistance element 193 of the voltage control circuit 19, the potential at the node 197 and the potential at the positive input terminal of the OP amplifier 191 become V2.

The voltage signal S2 input to the voltage control circuit 19 is input to the negative terminal of the OP amplifier 191. Since the output terminal of the OP amplifier 191 is fed back to the negative input terminal of the OP amplifier 191 via the resistance element 195, the difference between the voltage signal S2 and the potential V2 is amplified with a predetermined factor, and the control signal S3 is thus generated. More specifically, the value of the control signal S3 increases when the ratio between the output current I1 of the APD 11 and the output current I2 of the PIN-PD 13 deviates from a predetermined ratio. When the DC-DC converter 7 receives the control signal S3 from the voltage control circuit 19, it adjusts the voltage value of the supply voltage P1 such that the value of the control signal S3 approaches a predetermined value.

Due to the above-described operation, the supply voltage P1 applied to the APD 11 is controlled and the avalanche multiplication factor m of the APD 11 is maintained at the desired value. In the present embodiment, the resistance of the resistance element 193 may be determined on the basis of the product of the ratio of Iava$_2$ to Ipin$_2$ and the desired avalanche multiplication factor m (=m·(Iava$_2$/Ipin$_2$)), where Iava$_2$ is a measured current value of the output current I1 obtained by the APD 11 in the PIN mode when a quantity of light is incident, and Ipin$_2$ is a measured current value of the output current I2 obtained by the PIN-PD 13 at that time. The avalanche multiplication factor m can be changed by changing the resistance of the resistance element 193. When the resistance element 193 is a digital potentiometer, the avalanche multiplication factor m can be changed by an external signal. Examples of parameters used in the circuit diagram of FIG. 5 are shown below:

Output Current I1: 10 μA (Quantity of Signal Light L2: 0.95 μW)
Output Current I2: 50 nA (Quantity of Signal Light L3: 0.05 μW)
Current I3: 10 μA
Resistance Element 173: 100 kΩ
Resistance Element 193: 500 kΩ
Resistance Element 195: Preferably large enough to prevent the oscillation of a closed-loop relating to the OP amplifier 191.
Resistance Element 211: 1 kΩ
Resistance Element 213: 1 kΩ
Supply Voltage P1: 50 V
Potential V1: 5 mV
Potential V2: 5 mV As for the resistance elements 211, 213, and 193, and the current I3, the following parameters may be adopted instead of those mentioned above. In this case, the power consumption of the DC-DC converter 7 can be reduced to 11/20 compared to the case of the above-mentioned parameters.

Current I3: 1 μA
Resistance Element 211: 10 kΩ
Resistance Element 213: 1 kΩ
Resistance Element 193: 5 MΩ

The optical receiver 1 provides the following advantages. That is, in the optical receiver 1, the PIN-PD 13 transmits the signal light L2, which is a part of the received signal light L1, and causes the signal light L2 to be incident on the APD 11. Accordingly, the signal light L3 is detected by the PIN-PD 13 and the signal light L2 is detected by the APD 11. Therefore, the quantity of signal light L3 detected by the PIN-PD 13 and the quantity of signal light L2 detected by the APD 11 are not affected by the polarization state of the signal light incident on the optical receiver 1, and consequently the signal light can be caused to be incident on the PIN-PD 13 and the APD 11 at a constant rate of quantity of light. Thus, according to the optical receiver 1 of the present embodiment, the avalanche multiplication factor of the APD 11 is suitably controlled on the basis of the output current I2 of the PIN-PD 13.

The optical receiver 1 includes the control part 5 for controlling the supply voltage P1 applied to the APD 11 on the basis of the current value of the output current I2 from the PIN-PD 13 in order to maintain the avalanche multiplication factor m of the APD 11 at a predetermined value. The optical receiver 1 preferably includes such a control part 5, and thereby the avalanche multiplication factor m of the APD 11 can be suitably controlled.

Figure 6:
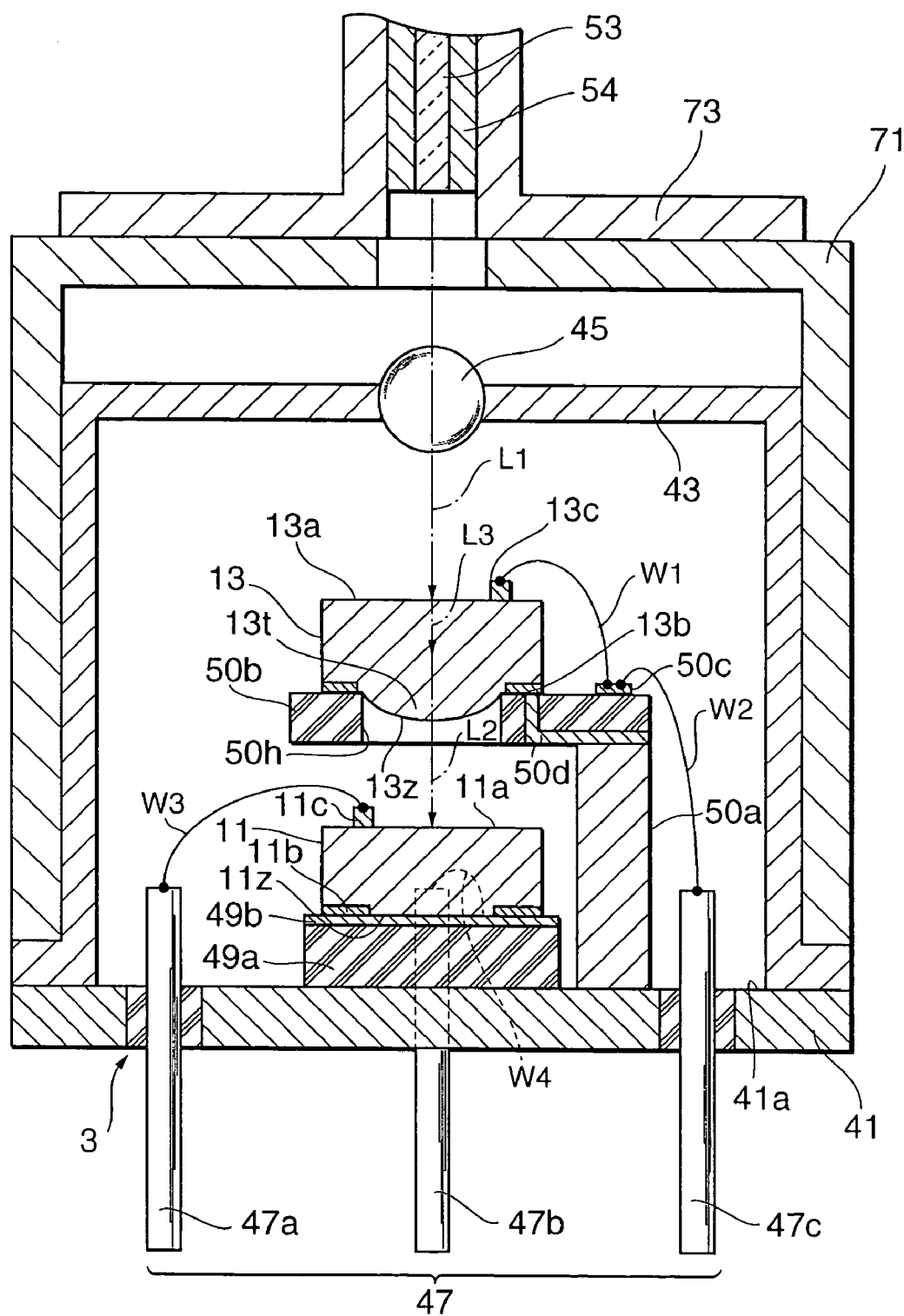
FIG. 6 is a sectional view showing another example of the optical module.
Figure 7:
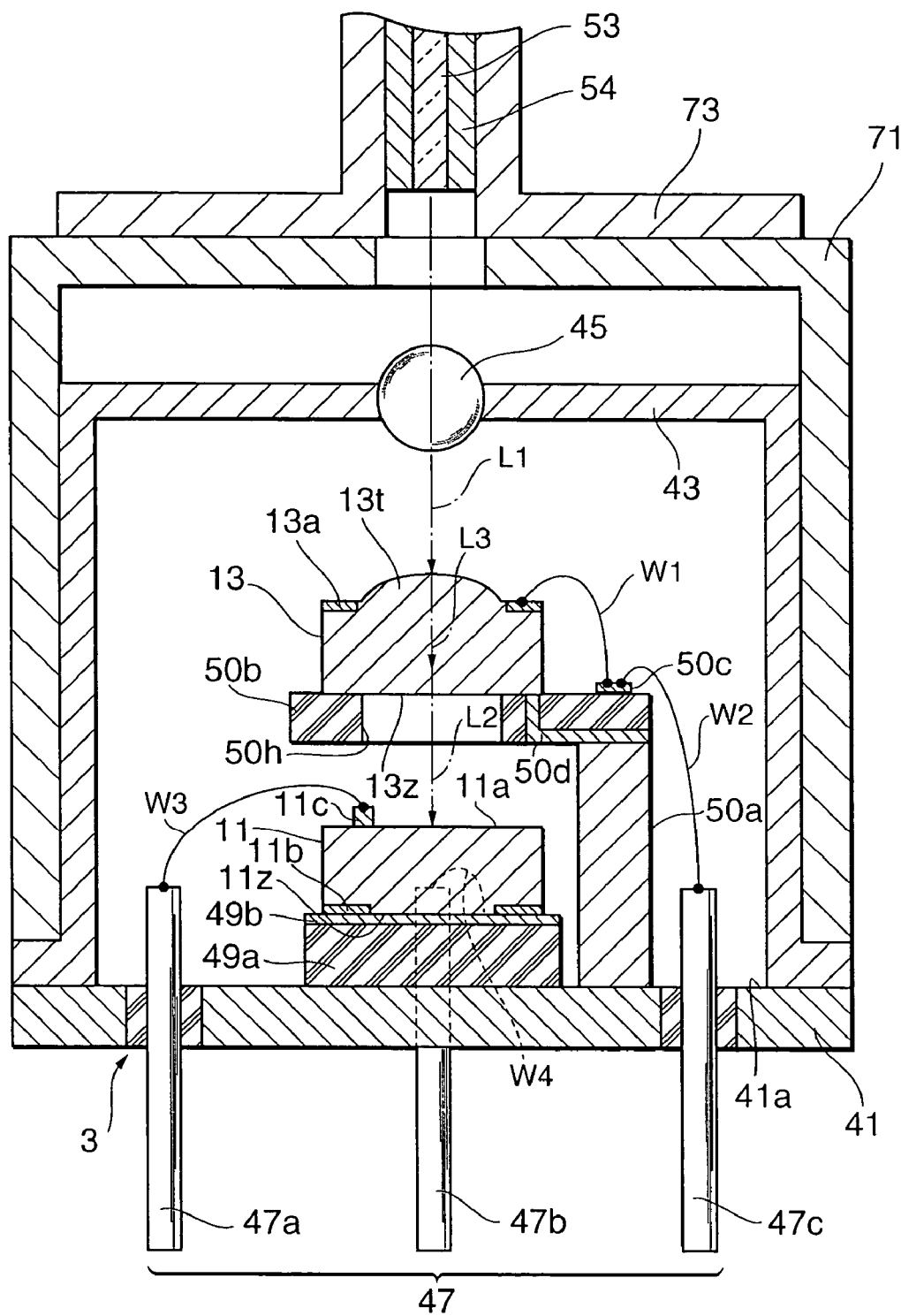
FIG. 7 is a sectional view showing another example of the optical module.

As shown in FIG. 6, in the above-described optical module 3, a monolithic lens 13t may be provided on the opposite surface 13z of the PIN-PD 13. In such a case, the monolithic lens 13t converges the signal light L2 which passes through the PIN-PD 13, so that the signal light L2 is efficiently incident on the APD 11. As shown in FIG. 7, the monolithic lens 13t may be provided in the incident surface 13a of the PIN-PD 13. In this case, the PIN-PD 13 is preferably a rear-illuminated-type photodiode with a PN junction provided on the opposite surface 13z of the PIN-PD 13.

In this case, the monolithic lens 13t converges the signal light L1 which is incident on the PIN-PD 13, and therefore the lens 45 can be omitted. The PIN-PD 13 is composed of a material whose refractive index is higher than that of normal glass. For example, the refractive index of normal glass is 1.2 to 2.0, whereas the refractive index of InP is 3.5. Therefore, when the monolithic lens 13t is used, the refraction angle is large and light converges to the APD 11 in a short distance. Accordingly, the PIN-PD 13 and the APD 11 can be disposed near each other and the size of the optical module can thus be reduced.

First Modification

Figure 8:
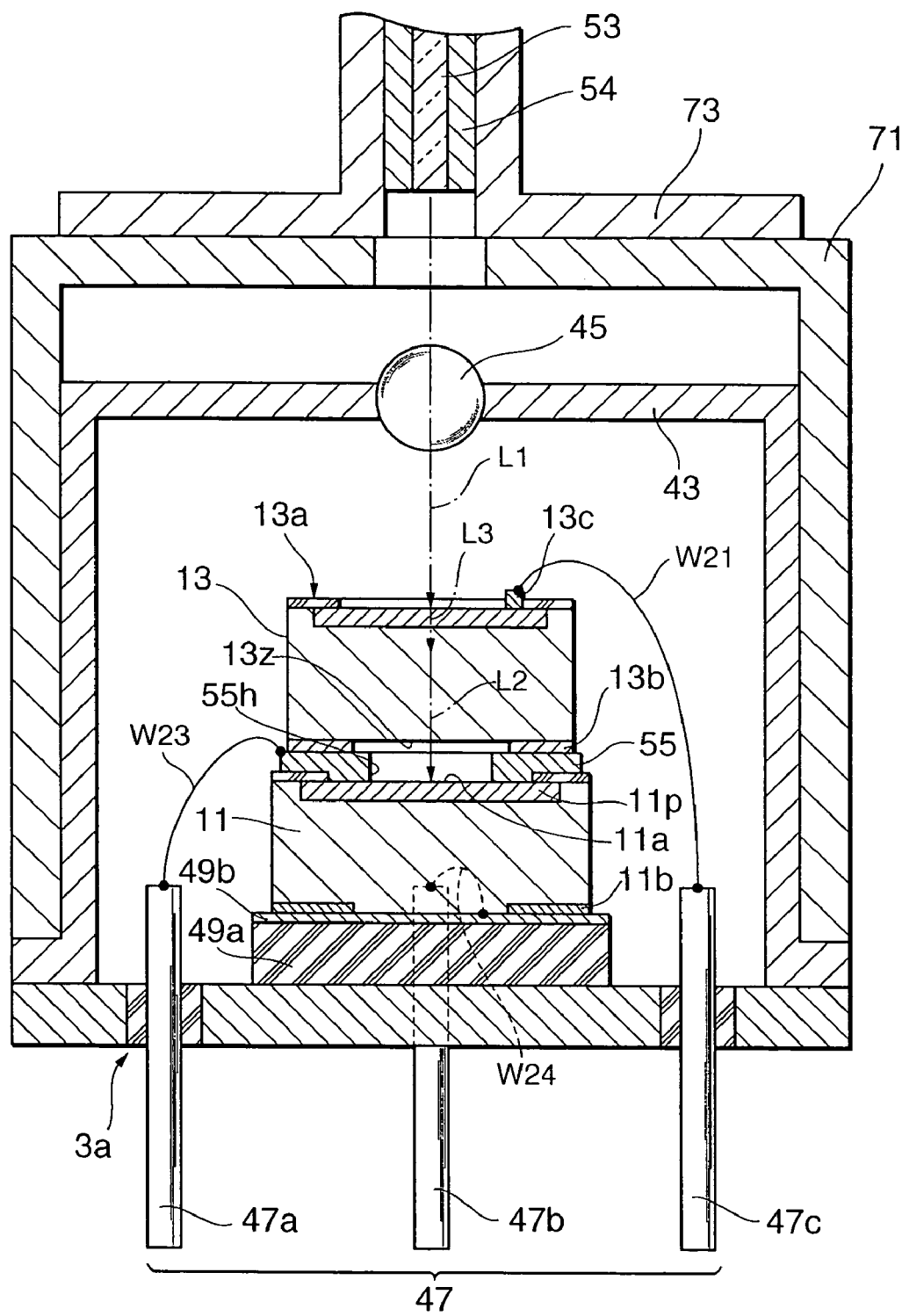
FIG. 8 is a sectional view of an optical module according to a first modification of the optical receiver.

A first modification of the optical receiver 1 according to the above-described embodiment will be described below. The difference between the first modification and the above-described embodiment is the configuration of the APD 11 and the PIN-PD 13. FIG. 8 is a sectional view of an APD 11 and a PIN-PD 13 included in an optical module 3a according to the present modification. In the optical module 3a according to the present modification, the APD 11, the PIN-PD 13, and a submount 49a are arranged along a predetermined axis. The PIN-PD 13 has an electrode 55. The APD 11 and the PIN-PD 13 are disposed near each other with the electrode 55 interposed therebetween.

The electrode 55 is electrically connected to a cathodic electrode 13b formed on an opposite surface 13z of the PIN-PD 13 and to a diffusion layer 11p formed in an incident surface 11a of the APD 11. The electrode 55 functions as a cathodic electrode of the PIN-PD 13 and as an anodic electrode of the APD 11. The electrode 55 is electrically connected to a lead pin 47a with a lead-wire W23. An anodic electrode 13c of the PIN-PD 13 is electrically connected to a lead pin 47c with a lead-wire W21. A cathodic electrode 11b of the APD 11 is electrically connected to an electrode 49b formed on the submount 49a. The electrode 49b is electrically connected to a lead pin 47b with a lead-wire W24. The electrode 55 has an opening 55h at the central region thereof. Light transmitted through the PIN-PD 13 travels through the opening 55h and is incident on the incident surface 11a of the APD 11.

Figure 9:
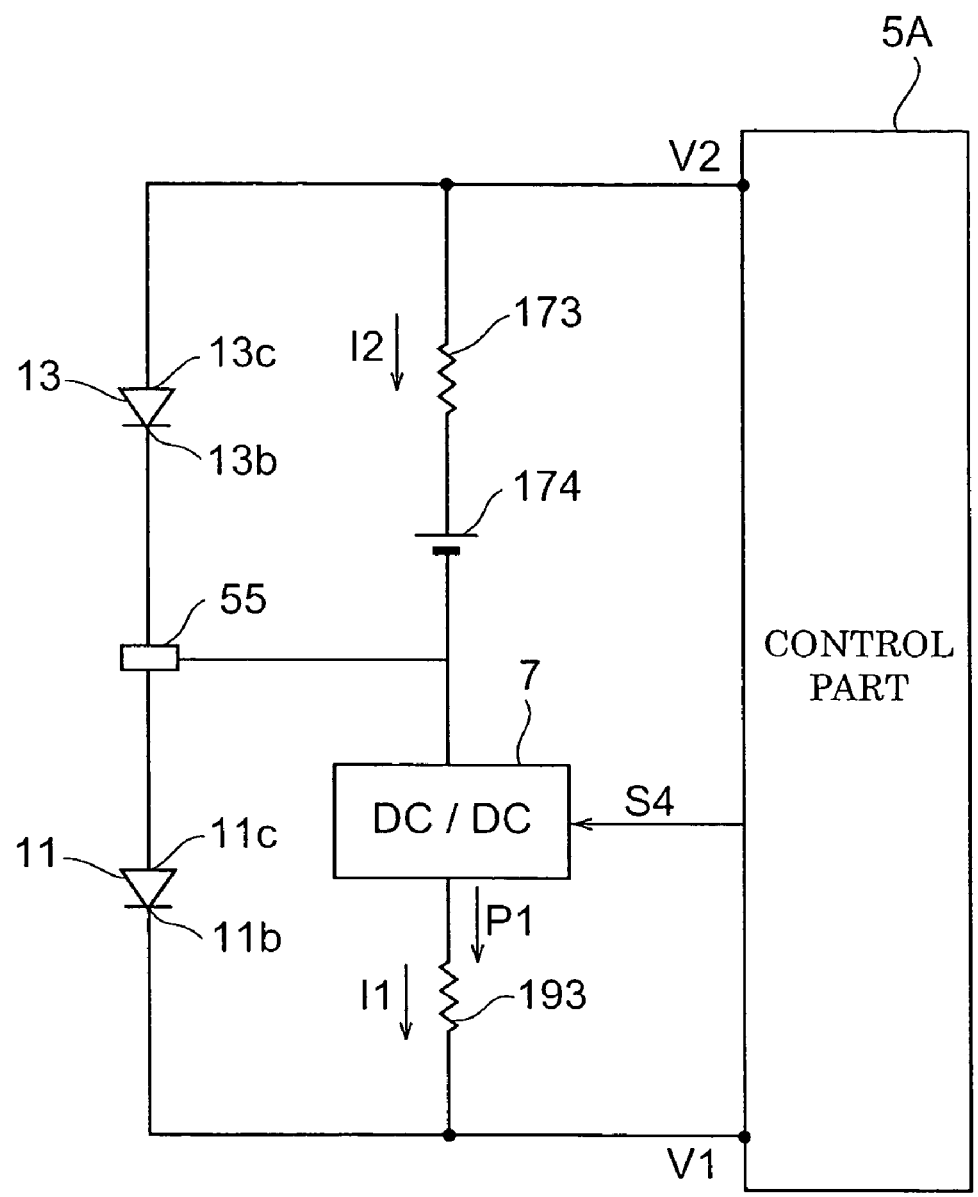
FIG. 9 is a circuit diagram schematically showing connections in a first modification of the optical receiver.

The manner in which the avalanche multiplication factor of the APD 11 is controlled will be described below with reference to FIG. 9. FIG. 9 is a schematic circuit diagram showing the connections between a control part 5A, the PIN-PD 13, and the APD 11. The control part 5A may be, for example, an arithmetic unit including a CPU or the like. The electrode 55 functions as a cathodic electrode of the PIN-PD 13 and as an anodic electrode of the APD 11. A power supply device 174 applies a reverse bias voltage of, for example, 3.3 V, between the electrode 55 and the anodic electrode 13c. A DC-DC converter 7 applies a reverse bias voltage P1 between the cathodic electrode 11b and the electrode 55. The control part 5A transmits a control signal S4 to the DC-DC converter 7. In accordance with the control signal S4, the DC-DC converter 7 adjusts the bias voltage to be applied between the cathodic electrode 11b and the electrode 55. The DC-DC converter 7 adjusts the bias voltage applied between the cathodic electrode 11b and the electrode 55 in accordance with the control signal S4.

When signal light L1 is incident on the optical module 3a, a current I2 corresponding to signal light L3 flows in the PIN-PD 13 and a current I1 corresponding to signal light L2 flows in the APD 11. At this time, the control part 5A receives an electric signal corresponding to a potential V2 at a point between the anodic electrode 13c and a resistance element 173 and an electric signal corresponding to a potential V1 at a point between the cathodic electrode 11b and a resistance element 193. The control part 5A calculates the current ratio of I1 to I2 on the basis of the potentials V1 and V2 corresponding to the electric signals input thereto. Then, the control part 5A controls the voltage P1 such that the calculated current ratio of I1 to I2 satisfies the following equation:

$$I1 = m \cdot I2 \cdot (Iava_2 / Ipin_2) \qquad (3)$$

The avalanche multiplication factor of the APD 11 can be controlled by controlling the voltage P1 as above.

The optical receiver 1 may include the optical module 3a according to the present modification in place of the optical module 3 shown in FIG. 3 and the control part 5A in place of the control part 5. Also in this case, advantages similar to those of the above-described embodiment are provided.

Second Modification

Figure 10:
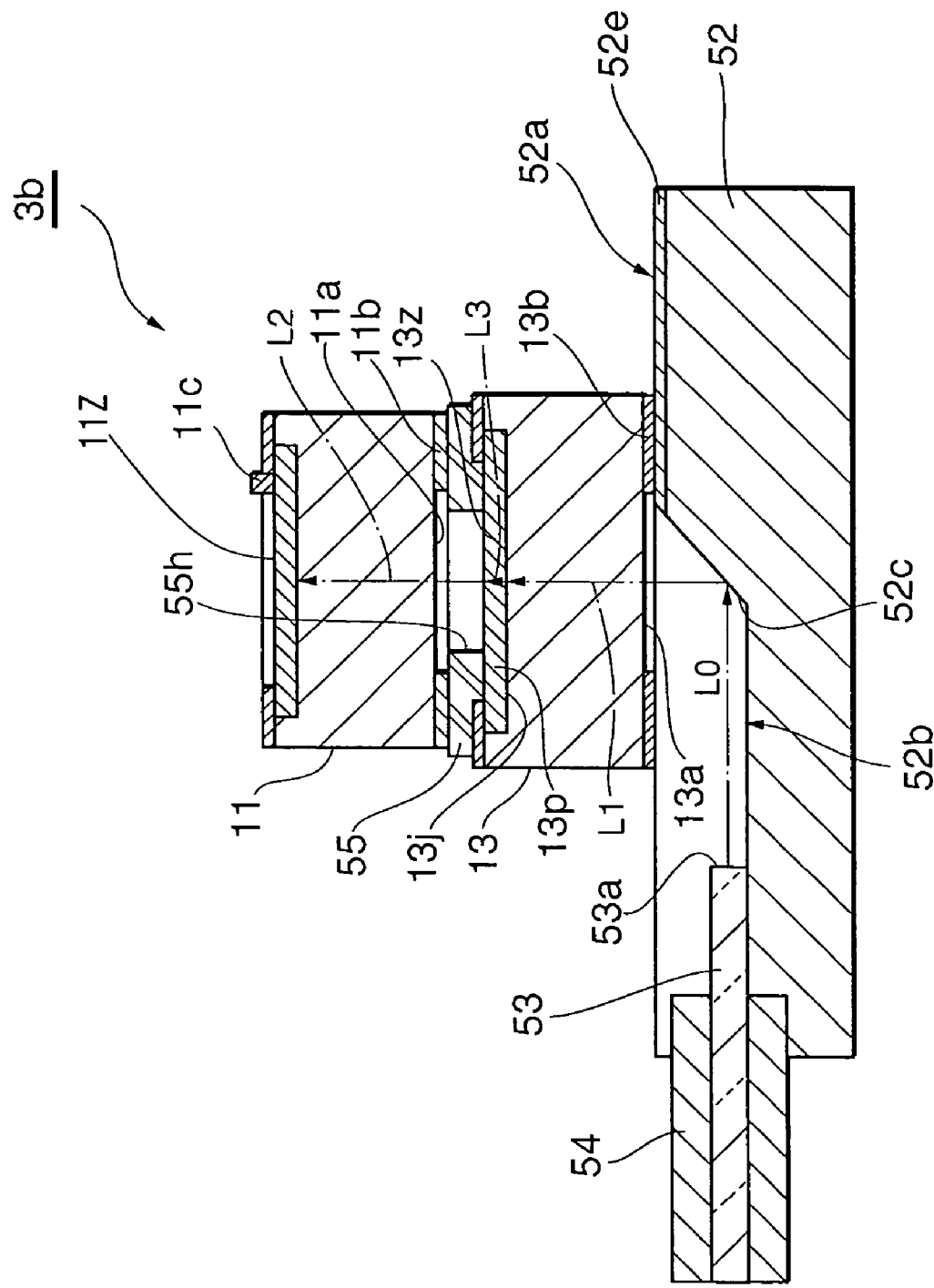
FIG. 10 is a sectional view of an optical module according to a second modification of the optical receiver.
Figure 11:
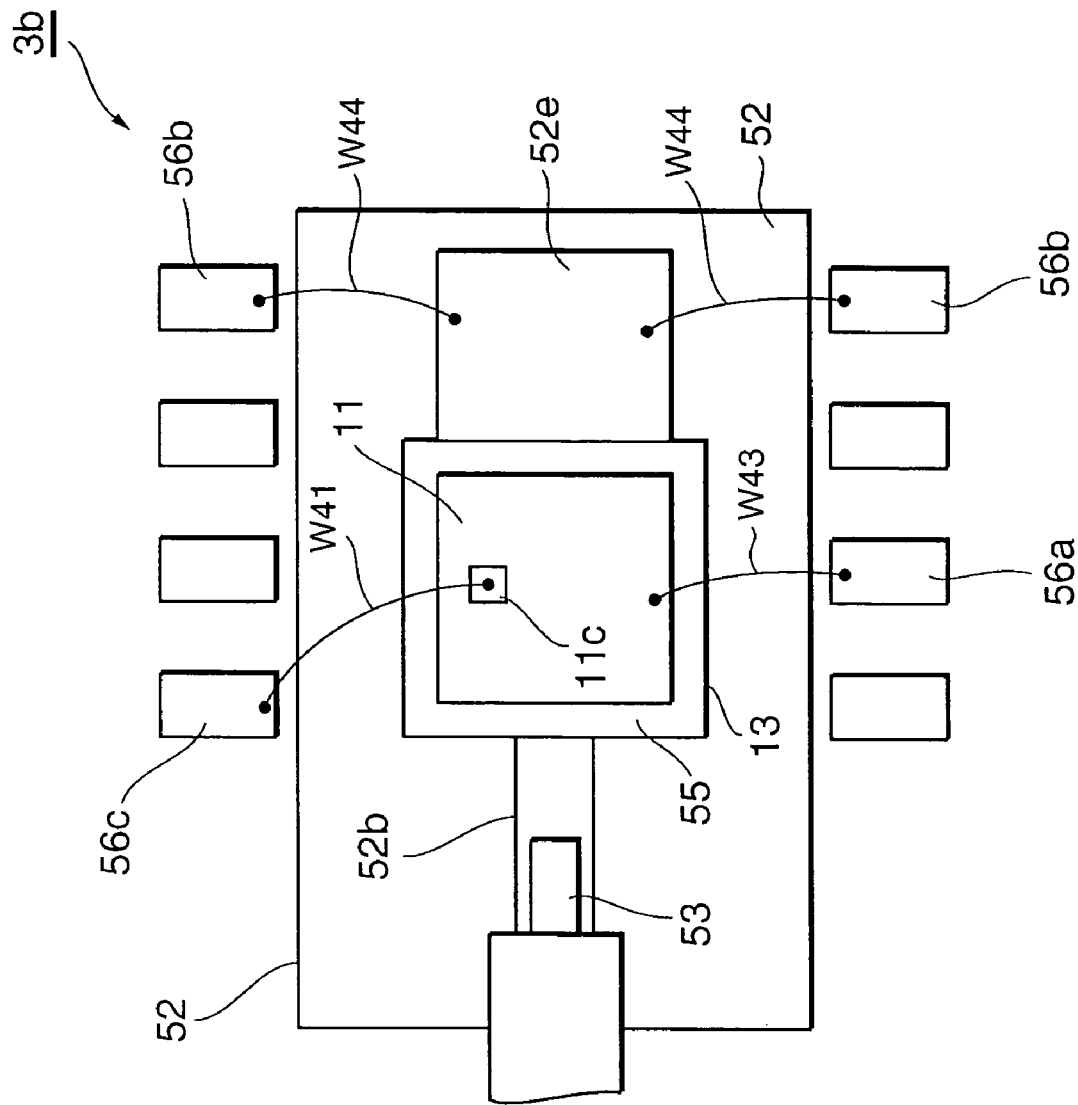
FIG. 11 is a plan view of an optical module according to the second modification of the optical receiver.

A second modification of the above-described optical receiver 1 will be described below. FIG. 10 is a sectional view of an optical module 3b according to a second modification of the optical receiver 1, and FIG. 11 is a plan view of the optical module 3b. The optical module 3b includes a substrate 52, an optical transmission medium 53, an APD 11, a PIN-PD 13, and an electrode 55. In addition, the optical receiver 1 according to the present modification includes a control part 5A similar to that of the first modification.

The substrate 52 is, for example, a silicon bench and has a groove 52b in a principal plane 52a of the substrate 52. The optical transmission medium 53, such as an optical fiber, is placed in the groove 52b. A reflective surface 52c is formed at an end of the groove 52b. The optical transmission medium 53 emits signal light L0 from an end face 53a thereof toward the reflective surface 52c. The reflective surface 52c reflects the signal light L0. The reflective surface 52c is inclined relative to the principal plane 52a, and reflects the signal light L0 toward the PIN-PD 13. The reflective surface 52c may be formed by plating Au at the end of the groove 52b.

The PIN-PD 13 is a rear-illuminated-type photodiode. The PIN-PD 13 is disposed such that an incident surface 13a thereof is in contact with the substrate 52. The PIN-PD 13 is positioned such that the incident surface 13a faces the reflective surface 52c, and the incident surface 13a receives signal light L1 from the reflective surface 52c. A PN junction 13j is formed on an opposite surface 13z of the PIN-PD 13 on the side opposite to the incident surface 13a. The PIN-PD 13 converts a part of the signal light L1 incident on the incident surface 13a (defined as signal light L3) into an output current I2. A part of the signal light L1 other than the signal light L3 (defined as signal light L2) is transmitted to the opposite surface 13z. The signal light L2 travels through an opening 55h formed in the electrode 55, which will be described below, and is incident on an incident surface 11a of the APD 11.

The APD 11 is a rear-illuminated-type photodiode. A PN junction 11j is formed on an opposite surface 11z of the APD 11 on the side opposite to the incident surface 11a. The APD 11 converts the signal light L2 incident on the incident surface 11a into an output current I1.

The electrode 55 is in contact with a diffusion layer 13p formed on the opposite surface 13z of the PIN-PD 13 and with a cathodic electrode 11b formed on the incident surface 11a of the APD 11. The electrode 55 functions as an anodic electrode of the PIN-PD 13 and as a cathodic electrode of the APD 11. The electrode 55 is electrically connected to an electrode 56a with a lead-wire W43. An anodic electrode 11c of the APD 11 is electrically connected to an electrode 56c with a lead-wire W41. A cathodic electrode 13b of the PIN-PD 13 is in contact with a pattern electrode 52e formed on the principal plane 52a of the substrate 52, and the pattern electrode 52e is electrically connected to electrodes 56b with lead-wires W44. The electrode 55 has the opening 55h at the central region thereof. The opposite surface 13z of the PIN-PD 13 and the incident surface 11a of the APD 11 are optically coupled to each other through the opening 55h.

Due to the above-described connections, the PIN-PD 13 provides the output current I2 to the outside of the optical module 3b via the electrodes 56a and 56b. The electrodes 56a and 56b are electrically connected to the control part 5A and to a predetermined power supply. The electrode 56c is electrically connected to an amplifier 9 (see FIG. 1). The optical receiver 1 according to the present modification includes a control part 5A similar to that of the first modification, and the avalanche multiplication factor of the APD 11 is controlled similarly to the first modification.

The optical receiver 1 may include the optical module 3b according to the present modification in place of the optical module 3 shown in FIG. 3. Also in this case, advantages similar to those of the above-described embodiment are provided. In addition, in the present modification, the incident surface 13a of the PIN-PD 13 faces the reflective surface 52c and receives light from the reflective surface 52c. Accordingly, since the reflective surface 52c for inputting the signal light is provided on the substrate 52, the size of the optical module 3b can be reduced. In addition, since the reflective surface 52c is formed on the substrate 52, the reflective surface 52c can be positioned near the incident surface 13a. Accordingly, it is not necessary to converge the signal light L1 to the PIN-PD 13 and the signal light L1 is directly incident on the incident surface 13a. In addition, in the present modification, since the APD 11 and the PIN-PD 13 are rear-illuminated-type photodiodes, the surface mounting technique can be used in the mounting process.

Third Modification

Figure 12:
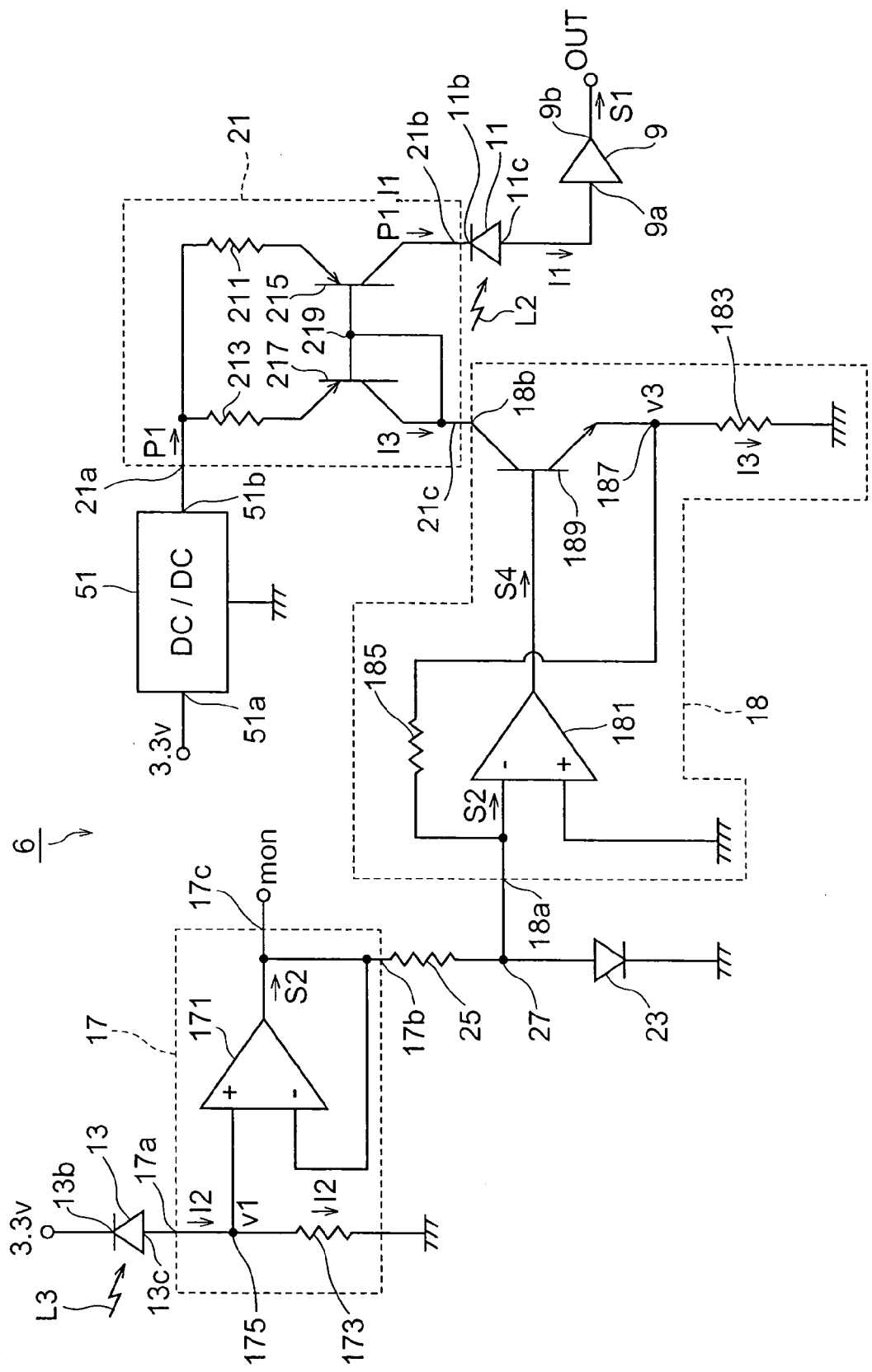
FIG. 12 is a circuit diagram showing an internal circuit of a control part according to a third modification of the optical receiver.
Figure 13:
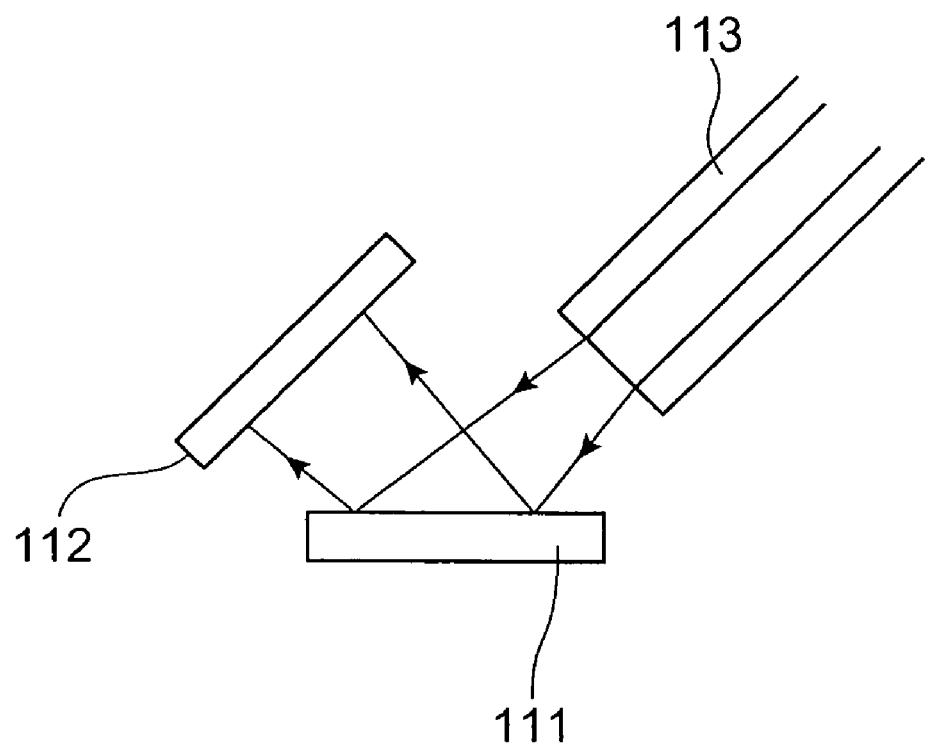
FIG. 13 is a diagram showing a known optical receiver.

FIG. 12 is a circuit diagram showing an internal circuit of a control part 6 as a third modification of the optical receiver 1. The structure of the control part 6 according to the present modification is similar to that of the control part 5 according to the above-described embodiment except for the following points. That is, the control part 6 according to the present modification includes a current control circuit 18 and a DC-DC converter 51 in place of the voltage control circuit 19 and the DC-DC converter 7, respectively, of the above-described embodiment. In addition, different from the above-described embodiment, in the control part 6 according to the present modification, an output 21b (second output) of a current mirror circuit 21 is electrically connected to a cathodic electrode 11b of an APD 11 and an output 21c (first output) of the current mirror circuit 21 is electrically connected to the current control circuit 18.

The current control circuit 18 includes an OP amplifier 181, resistance elements 183 and 185, and an NPN transistor 189. In addition, the current control circuit 18 has inputs 18a and 18b. A negative input terminal of the OP amplifier 181 is electrically connected to a node 27 via the input 18a, and is also electrically connected to a node 187 via the resistance element 185. A positive input terminal of the OP amplifier 181 is electrically connected to a reference voltage wire. An output terminal of the OP amplifier 181 is electrically connected to the base terminal of the transistor 189. The collector terminal of the transistor 189 is electrically connected to the output 21c of the current mirror circuit 21 via the input 18b. The emitter terminal of the transistor 189 is electrically connected to a reference voltage wire via the node 187 and the resistance element 183.

The DC-DC converter 51 functions as a power supply circuit in the present modification, and has an input 51a and an output 51b. The input 51a is electrically connected to a power-supply terminal of a predetermined voltage (for example, 3.3 V). The output 51b is electrically connected to an input 21a of the current mirror circuit 21. Different from the DC-DC converter 7 according to the above-described embodiment, the DC-DC converter 51 converts the supply voltage obtained from the power-supply terminal into a predetermined supply voltage P1 (for example, 80V). The DC-DC converter 51 then supplies the supply voltage P1 to the current mirror circuit 21 from the output 51b.

Next, the operation of the present modification will be described below. In the following description, explanations similar to those of the optical receiver 1 according to the above-described embodiment are omitted.

When signal light L3 is incident on a PIN-PD 13, a voltage signal S2 is generated by a converting circuit 17 and is input to the current control circuit 18. The voltage signal S2 is input to the negative terminal of the OP amplifier 181. Then, the OP amplifier 181 generates a control signal S4. The control signal S4 is input to the base terminal of the transistor 189, and a current I3 corresponding to the control signal S4 flows between the collector terminal and the emitter terminal of the transistor 189. When the current I3 flows through the resistance element 183, a potential V3 is generated at the node 187 and the potential V3 is fed back to the negative input terminal of the OP amplifier 181 via the resistance element 185. Therefore, the voltage of the control signal S4 becomes equivalent to the product of the voltage of the voltage signal S2 and a predetermined factor, and the amount of current I3 is determined according to the voltage of the control signal S4.

The DC-DC converter 51 applies the supply voltage P1 between the cathodic electrode 11b and the anodic electrode 11c of the APD 11 as a reverse bias voltage via the current mirror circuit 21. When signal light L2 is incident on the APD 11, an output current I1 flows in the APD 11. At this time, the current mirror circuit 21 operates such that the amount of output current I1 which flows through a resistance element 211 and a transistor 215 is substantially equal to the amount of current I3 which flows through a resistance element 213 and a transistor 217. More specifically, the amount of current I3 is controlled by the current control circuit 18 as described above, and the amount of output current I1 which flows into the APD 11 is substantially equal to the amount of current I3. The output current I1 is converted into a voltage signal by the amplifier 9 so as to be a received signal S1, and the received signal S1 is supplied to the outside of the optical receiver 1.

Due to the above-described operation, the output current I1 of the APD 11 is controlled, and the avalanche multiplication factor m of the APD 11 is maintained at the desired value. As in the above-described embodiment, also in the present modification, the current value of the output current I1 obtained by the APD 11 in the PIN mode when a predetermined quantity of light is incident (=Iava$_2$) and the current value of the output current I2 obtained by the PIN-PD 13 at that time (=Ipin$_2$) may be measured first, and thereafter the resistance of the resistance element 183 may be set on the basis of the product of the ratio of Iava2 to Ipin2 and the desired avalanche multiplication factor m (=m·(Iava$_2$/Ipin$_2$)).

In the present modification, the control part 6 controls the output current I1, which flows in the APD 11, on the basis of the current value of the output current I2 from the PIN-PD 13 such that the avalanche multiplication factor m of the APD 11 is maintained at a predetermined value. Thus, also when the optical receiver 1 includes the control part 6 in place of the control part 5, the avalanche multiplication factor of the APD 11 can be suitably controlled.

The optical receiver according to the present invention is not limited to the above-described embodiment and modifications, and other various modifications are possible. For example, although the transmissivity of the PIN-PD is set such that the ratio of the quantity of signal light input to the APD to the quantity of signal light input to the PIN-PD is in the range of 9:1 to 99:1, the ratio may also be set to other desired values. In the above-described embodiment, the control part controls the supply voltage applied to the APD, and in the third modification, the control part controls the amount of current which flows in the APD; however, the control unit may control both the supply voltage and the current at the same time.

What is claimed is:

1. An optical receiver comprising:
    a PIN photodiode having an incident surface for receiving signal light, the PIN photodiode transmitting a part of the signal light to the surface opposite to the incident surface; and
    an avalanche photodiode having an incident surface for receiving light transmitted through the PIN photodiode.

2. The optical receiver according to claim 1, further comprising:
    a stem having a principal plane; and
    a mounting part provided on the principal plane of the stem, the PIN photodiode being mounted on the mounting part,
    wherein the avalanche photodiode is disposed between the PIN photodiode and the principal plane and receives, via an opening provided in the mounting part, the light transmitted through the PIN photodiode.

3. The optical receiver according to claim 2, further comprising a control means for controlling, on the basis of an output current value obtained from the PIN photodiode, either one or both of a supply voltage applied to the avalanche photodiode and a current flowing through the avalanche photodiode such that an avalanche multiplication factor of the avalanche photodiode is maintained at a predetermined value.

4. The optical receiver according to claim 3, wherein the control means controls either one or both of the supply voltage applied to the avalanche photodiode and the current flowing through the avalanche photodiode such that an average output current value obtained from the avalanche photodiode when the signal light is incident approaches m·Ipin1·(Iava$_2$/Ipin$_2$), where Iava$_2$ is an output current value of the avalanche photodiode in a PIN mode and Ipin$_2$ is an output current value of the PIN photodiode, respectively, when a quantity of light is incident, and m is a desired avalanche multiplication factor, and Ipin1 is the output current value of the PIN photodiode.

5. The optical receiver according to claim 1, further comprising a stem on which the avalanche photodiode is mounted,
    wherein the PIN photodiode is mounted on the avalanche photodiode.

6. The optical receiver according to claim 5, further comprising a control means for controlling, on the basis of an output current value obtained from the PIN photodiode, either one or both of a supply voltage applied to the avalanche photodiode and a current flowing through the avalanche photodiode such that an avalanche multiplication factor of the avalanche photodiode is maintained at a predetermined value.

7. The optical receiver according to claim 6, wherein the control means controls either one or both of the supply voltage applied to the avalanche photodiode and the current flowing through the avalanche photodiode such that an average output current value obtained from the avalanche photodiode when the signal light is incident approaches m·Ipin1·(Iava$_2$/Ipin$_2$), where Iava$_2$ is an output current value of the avalanche photodiode in a PIN mode and Ipin$_2$ is an output current value of the PIN photodiode, respectively, when a quantity of light is incident, and m is a desired avalanche multiplication factor, and Ipin1 is the output current value of the PIN photodiode.

8. The optical receiver according to claim 1, further comprising a control means for controlling, on the basis of an output current value obtained from the PIN photodiode, either one or both of a supply voltage applied to the avalanche photodiode and a current flowing through the avalanche photodiode such that an avalanche multiplication factor of the avalanche photodiode is maintained at a predetermined value.

9. The optical receiver according to claim 8, wherein the control means controls either one or both of the supply voltage applied to the avalanche photodiode and the current flowing through the avalanche photodiode such that an average output current value obtained from the avalanche photodiode when the signal light is incident approaches m·Ipin1·(Iava$_2$/Ipin$_2$), where Iava$_2$ is an output current value of the avalanche photodiode in a PIN mode and Ipin$_2$ is an output current value of the PIN photodiode, respectively, when a quantity of light is incident, and m is a desired avalanche multiplication factor, and Ipin1 is the output current value of the PIN photodiode.

10. The optical receiver according to claims 9, wherein the control means comprises:
    a converting circuit for converting the output current value obtained from the PIN photodiode into a voltage signal;
    a current mirror circuit having an input, a first output, and a second output, the ratio of the amount of current at the second output to the amount of current at the first output being maintained at a predetermined ratio and the first output being connected to the avalanche photodiode;
    a power supply circuit for supplying the supply voltage to the input of the current mirror circuit; and
    a voltage control circuit for controlling the supply voltage on the basis of the voltage signal obtained from the converting circuit and the amount of current at the second output of the current mirror circuit.

11. The optical receiver according to claim 9, wherein the control means includes:
a converting circuit for converting the output current value obtained from the PIN photodiode into a voltage signal;
a current mirror circuit having an input, a first output, and a second output, the ratio of the amount of current at the second output to the amount of current at the first output being maintained at a predetermined ratio and the second output being connected to the avalanche photodiode;
a power supply circuit for supplying the supply voltage to the input of the current mirror circuit; and
a current control circuit for controlling the amount of current at the first output of the current mirror circuit on the basis of the voltage signal obtained from the converting circuit.

12. The optical receiver according to claims 8, wherein the control means comprises:
a converting circuit for converting the output current value obtained from the PIN photodiode into a voltage signal;
a current mirror circuit having an input, a first output, and a second output, the ratio of the amount of current at the second output to the amount of current at the first output being maintained at a predetermined ratio and the first output being connected to the avalanche photodiode;
a power supply circuit for supplying the supply voltage to the input of the current mirror circuit; and
a voltage control circuit for controlling the supply voltage on the basis of the voltage signal obtained from the converting circuit and the amount of current at the second output of the current mirror circuit.

13. The optical receiver according to claim 8, wherein the control means includes:
a converting circuit for converting the output current value obtained from the PIN photodiode into a voltage signal;
a current mirror circuit having an input, a first output, and a second output, the ratio of the amount of current at the second output to the amount of current at the first output being maintained at a predetermined ratio and the second output being connected to the avalanche photodiode;
a power supply circuit for supplying the supply voltage to the input of the current mirror circuit; and
a current control circuit for controlling the amount of current at the first output of the current mirror circuit on the basis of the voltage signal obtained from the converting circuit.

14. An optical receiver comprising:
a substrate having a principal plane, a groove provided in the principal plane, and a reflective surface provided at one end of the groove;
an optical transmission medium provided in the groove;
a PIN photodiode provided on the principal plane; and
an avalanche photodiode mounted on the PIN photodiode, wherein the PIN photodiode has an incident surface for receiving, via the reflective surface, signal light emitted from the optical transmission medium, and transmits a part of the signal light incident on the incident surface to the surface opposite to the incident surface, wherein the avalanche photodiode has an incident surface for receiving light transmitted through the PIN photodiode.

15. The optical receiver according to claim 14, further comprising a control means for controlling, on the basis of an output current value obtained from the PIN photodiode, either one or both of a supply voltage applied to the avalanche photodiode and a current flowing through the avalanche photodiode such that an avalanche multiplication factor of the avalanche photodiode is maintained at a predetermined value.

16. The optical receiver according to claim 15, wherein the control means controls either one or both of the supply voltage applied to the avalanche photodiode and the current flowing through the avalanche photodiode such that an average output current value obtained from the avalanche photodiode when the signal light is incident approaches $m \cdot Ipin1 \cdot (Iava_2/Ipin_2)$, where $Iava_2$ is an output current value of the avalanche photodiode in a PIN mode and $Ipin_2$ is an output current value of the PIN photodiode, respectively, when a quantity of light is incident, and m is a desired avalanche multiplication factor, and $Ipin1$ is the output current value of the PIN photodiode.

17. The optical receiver according to claims 16, wherein the control means comprises:
a converting circuit for converting the output current value obtained from the PIN photodiode into a voltage signal;
a current mirror circuit having an input, a first output, and a second output, the ratio of the amount of current at the second output to the amount of current at the first output being maintained at a predetermined ratio and the first output being connected to the avalanche photodiode;
a power supply circuit for supplying the supply voltage to the input of the current mirror circuit; and
a voltage control circuit for controlling the supply voltage on the basis of the voltage signal obtained from the converting circuit and the amount of current at the second output of the current mirror circuit.

18. The optical receiver according to claim 16, wherein the control means includes:
a converting circuit for converting the output current value obtained from the PIN photodiode into a voltage signal;
a current mirror circuit having an input, a first output, and a second output, the ratio of the amount of current at the second output to the amount of current at the first output being maintained at a predetermined ratio and the second output being connected to the avalanche photodiode;
a power supply circuit for supplying the supply voltage to the input of the current mirror circuit; and
a current control circuit for controlling the amount of current at the first output of the current mirror circuit on the basis of the voltage signal obtained from the converting circuit.

19. The optical receiver according to claims 15, wherein the control means comprises:
a converting circuit for converting the output current value obtained from the PIN photodiode into a voltage signal;
a current mirror circuit having an input, a first output, and a second output, the ratio of the amount of current at the second output to the amount of current at the first output being maintained at a predetermined ratio and the first output being connected to the avalanche photodiode;

a power supply circuit for supplying the supply voltage to the input of the current mirror circuit; and a voltage control circuit for controlling the supply voltage on the basis of the voltage signal obtained from the converting circuit and the amount of current at the second output of the current mirror circuit.

20. The optical receiver according to claim 15, wherein the control means includes:

a converting circuit for converting the output current value obtained from the PIN photodiode into a voltage signal;

a current mirror circuit having an input, a first output, and a second output, the ratio of the amount of current at the second output to the amount of current at the first output being maintained at a predetermined ratio and the second output being connected to the avalanche photodiode;

a power supply circuit for supplying the supply voltage to the input of the current mirror circuit; and a current control circuit for controlling the amount of current at the first output of the current mirror circuit on the basis of the voltage signal obtained from the converting circuit.

* * * * *